US012804938B2

(12) United States Patent
Cheng

(10) Patent No.: US 12,804,938 B2
(45) Date of Patent: Nov. 17, 2026

(54) SEMICONDUCTOR STRUCTURES COMPRISING STRIP TRENCHES AND PROTRUSIONS AND MANUFACTURING METHODS THEREFOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 357 days.

(21) Appl. No.: 18/404,942

(22) Filed: Jan. 5, 2024

(65) Prior Publication Data

US 2024/0234562 A1 Jul. 11, 2024

(30) Foreign Application Priority Data

Jan. 9, 2023 (CN) ........................ 202310027880.0

(51) Int. Cl.

*H10D 30/47* (2025.01)
*H10D 30/01* (2025.01)
*H10D 62/10* (2025.01)
*H10D 62/85* (2025.01)

(52) U.S. Cl.

CPC ......... *H10D 30/475* (2025.01); *H10D 30/015* (2025.01); *H10D 62/125* (2025.01); *H10D 62/8503* (2025.01)

(58) Field of Classification Search

CPC ............... H10D 30/475; H10D 30/015; H10D 30/4755; H10D 64/513; H10D 62/8503; H10D 62/824; H10D 62/125; H10D 62/117; H10D 62/124; H10D 30/474; H10D 30/478; H10D 62/105

USPC .......................................................... 257/194

See application file for complete search history.

(56) References Cited

U.S. PATENT DOCUMENTS 9,431,527 B1 * 8/2016 Luo ...................... H10D 30/475
11,195,945 B2 * 12/2021 Lin ...................... H10D 30/015
2010/0025730 A1 * 2/2010 Heikman ............. H10D 30/015 257/E21.403
2015/0349124 A1 * 12/2015 Lu ........................ H10D 62/235 438/105
2016/0300941 A1 * 10/2016 Cheng ................ H10D 30/4755
2017/0250273 A1 * 8/2017 Schultz .............. H10D 30/4732
2020/0185508 A1 * 6/2020 Macelwee ............ H10D 30/015
2023/0078017 A1 * 3/2023 Jones ..................... H10D 30/47 257/350
2023/0197840 A1 * 6/2023 Bajaj .................. H10D 30/4738 257/76

* cited by examiner

*Primary Examiner* — Didarul A Mazumder

(74) *Attorney, Agent, or Firm* — Carroll, Hoette & Butscher, LLC; Christopher R. Carroll

(57) ABSTRACT

The present disclosure provides a semiconductor structure, including a substrate structure and a heterojunction structure, where a surface of the substrate structure is provided with first strip trenches and a first protrusion between any adjacent two of the first strip trenches, and the first strip trenches and the first protrusions extend in a first direction; where the heterojunction structure including a channel layer and a barrier layer, the heterojunction structure conformally covers the substrate structure, and the heterojunction structure includes first polarization regions respectively corresponding to the first strip trenches and second polarization regions respectively corresponding to the first protrusions.

20 Claims, 5 Drawing Sheets

SEMICONDUCTOR STRUCTURES COMPRISING STRIP TRENCHES AND PROTRUSIONS AND MANUFACTURING METHODS THEREFOR

CROSS REFERENCE TO RELATED APPLICATIONS

This application claims priority to Chinese Patent Application No. 2023100278800 filed on Jan. 9, 2023, the entire content of which is incorporated herein by reference.

TECHNICAL FIELD

The present disclosure relates to the technical field of semiconductor, in particular to semiconductor structures and manufacturing methods therefor.

BACKGROUND

Gallium nitride (GaN), as a representative of the third generation of wide band gap semiconductor, is attracting widespread attention. Properties of GaN mainly include high electron mobility and high two-dimensional electron gas (2DEG) concentration. In addition, GaN material has stable chemical properties, high temperature resistance and corrosion resistance, and has inherent advantages in high-frequency, high-power, and radiation-resistant applications. High electron mobility transistors (HEMTs) based on AlGaN/GaN heterojunction have been widely used in the semiconductor field. These devices have the properties of high reverse blocking voltage, low forward conduction resistance, and high operating frequency, so they can meet the system's requirements for semiconductor devices operating with higher power, higher frequency and smaller volume.

In fields such as communication, the linearity of a semiconductor device is an important parameter. However, due to factors such as the decrease in the electron saturation speed and the increase in the device series resistance, the transconductance of the ordinary HEMT device will increase with the increase of the gate-source bias voltage, and then decrease after reaching a certain peak value. The decrease of the transconductance can affect the linearity of the device.

SUMMARY

The purpose of the present disclosure is to provide semiconductor structures and manufacturing methods therefor, which can improve linearity.

According to an aspect of the present disclosure, a semiconductor structure is provided, including:

- a substrate structure, where a surface of the substrate structure is provided with first strip trenches and a first protrusion between any adjacent two of the first strip trenches, and the first strip trenches and the first protrusions extend in a first direction;
- a heterojunction structure, including a channel layer and a barrier layer, where the heterojunction structure conformally covers the substrate structure, and the heterojunction structure includes first polarization regions respectively corresponding to the first strip trenches and second polarization regions respectively corresponding to the first protrusions;
- where the heterojunction structure includes a source region, a drain region, and a gate region located between the source region and the drain region, and the source region, the gate region, and the drain region extend in a second direction perpendicular to the first direction;
- a gate electrode on the gate region;
- a source electrode on the source region; and
- a drain electrode on the drain region.

In some embodiments, a thickness of the barrier layer in each of the first polarization regions is different from a thickness of the barrier layer in each of the second polarization regions.

In some embodiments, a thickness of the barrier layer in each of the first polarization regions is smaller than a thickness of the barrier layer in each of the second polarization regions.

In some embodiments, a material of the barrier layer is AlGaN, and a proportion of Al component in the barrier layer in the first polarization regions is different from a proportion of Al component in the barrier layer in the second polarization regions.

In some embodiments, widths of the first strip trenches are constant, and widths of the first protrusions change; or

- widths of the first strip trenches change, and widths the first protrusions are constant; or
- widths of the first strip trenches and widths of the first protrusions change in proportion; or
- widths of the first strip trenches and widths of the first protrusions change in inverse proportion.

In some embodiments, a ratio of a width of one of the first polarization regions to a width of one of the second polarization regions is between 0.3 and 3.

In some embodiments, thicknesses of the barrier layer in at least two of the first polarization regions are different; and/or thicknesses of the barrier layer in at least two of the second polarization regions are different.

In some embodiments, along the second direction, thicknesses of the barrier layer in the first polarization regions and/or the second polarization regions gradually decrease, gradually increase, first increase and then decrease, first decrease and then increase, or periodically varies.

In some embodiments, a material of the barrier layer is AlGaN, where proportions of Al component in the barrier layer in at least two of the first polarization regions are different; and/or proportions of Al component in the barrier layer in at least two of the second polarization regions are different.

In some embodiments, along the second direction, the proportions of Al component in the barrier layer in the first polarization regions and/or the second polarization regions gradually decrease, gradually increase, first increase and then decrease, first decrease and then increase, or periodically varies.

In some embodiments, depths of the first strip trenches are constant, and widths of the first strip trenches change; or

- widths of the first strip trenches are constant and depths of the first strip trenches change; or
- widths and depths of the first strip trenches change in proportion; or
- widths and depths of the first strip trenches change in inverse proportion.

In some embodiments, a ratio of a depth to a width of each of the first strip trenches is 0.3-3.

In some embodiments, the semiconductor structure further includes:

- a gate dielectric layer covering the gate region, where the gate electrode is on a side of the gate dielectric layer facing away from the substrate structure.

In some embodiments, the heterojunction structure further includes:

a back barrier layer on a side of the channel layer facing away from the barrier layer.

In some embodiments, the heterojunction structure is a multi-channel heterojunction, including multiple channel layers and multiple barrier layers alternately arranged from bottom to top.

In some embodiments, at least two of the multiple barrier layers have different thicknesses and/or proportions of a component.

In some embodiments, the substrate structure includes a fifth strip trench on a surface corresponding to the gate region, and the fifth strip trench is perpendicular to the first strip trenches; and the gate region is provided with a sixth strip trench corresponding to the fifth strip trench, and the gate electrode fills the sixth strip trench.

In some embodiments, both the source region and the drain region are provided with n-type semiconductor layers, and the source electrode and the drain electrode cover the n-type semiconductor layers.

In some embodiments, the gate region is provided with a p-type semiconductor layer, and the gate electrode covers the p-type semiconductor layer.

According to an aspect of the present disclosure, a manufacturing method for a semiconductor structure is provided, including:

a substrate structure, where a surface of the substrate structure is provided with first strip trenches and a first protrusion between any adjacent two of the first strip trenches, and the first strip trenches and the first protrusions extend in a first direction;

forming a heterojunction structure, including a channel layer and a barrier layer, where the heterojunction structure includes first polarization regions respectively corresponding to the first strip trenches and second polarization regions respectively corresponding to the first protrusions; where the heterojunction structure includes a source region, a drain region, and a gate region located between the source region and the drain region, and the source region, the gate region, and the drain region extend in a second direction perpendicular to the first direction;

forming a gate electrode on the gate region;

forming a source electrode on the source region; and forming a drain electrode on the drain region.

Compared with the prior art, the present disclosure has the following beneficial effects:

In some embodiments, the HEMT structure in the present disclosure includes a patterned substrate structure and a heterojunction structure. The heterojunction structure includes multiple first polarization regions corresponding to multiple first strip trenches and multiple second polarization regions corresponding to multiple first protrusions. The different positions of the first polarization regions and the second polarization regions are equivalent to multiple heterojunction structures parallelly connected between the source electrode and the drain electrode, which is, compared to the HEMT device with a planar heterojunction structure, advantageous to achieve mutual compensation of different transconductances of the device, realizes relative stability of transconductance within a large gate-source bias range, is beneficial for increasing the breakdown voltage, improves dynamic characteristics, and enables the device to have good linearity.

In some embodiments, in the HEMT structure in the present disclosure, the proportions of components, thicknesses, and/or widths of the barrier layer in the first polarization regions and second polarization regions are different, which changes the transconductance peaks corresponding to the first polarization regions and second polarization regions, changes the threshold voltage of each heterojunction structure, and improves the linear operating characteristics of the device through the multiple heterojunction structures.

In some embodiments, the thickness of the barrier layer in the first polarization region is smaller than the thickness of the barrier layer in the second polarization region, which enhances the control ability of the gate electrode over the first polarization regions, increases carrier density, maintains stable semiconductor mobility, reduces equivalent sheet resistance, and greatly improves the frequency characteristic of the device.

In some embodiments, in the HEMT structure provided in the present disclosure, through stacked multiple layers of heterojunction structures, equivalent sheet resistance and contact resistance are effectively reduced, and a frequency characteristic of a device is improved. The component proportions of at least two barrier layers are different to achieve mutual compensation of transconductance, achieving a relatively stable transconductance within a large gate-source bias voltage range, and increasing an electron saturation rate, which can make a device have good linearity.

In some embodiments, a high proportion of Al component of the barrier layer can have a high 2DEG density, and the saturation current of the device is greatly increased. For devices in power applications, the increase in saturation current is critical. In the HEMT device of the present disclosure, through adjusting the proportion of Al component in the barrier layer in the first polarization regions and second polarization regions, the saturation current of each polarization region is adjusted, and the peak transconductance of the heterojunction structure is adjusted to trend towards uniform. The semiconductor structure in the present disclosure can be regarded as a parallel connection of several devices with different transconductance distributions. Through the structure of the parallel connection, mutual compensation of different transconductances of the device is achieved, thereby achieving a relative stable transconductance value within a large gate-source bias voltage range, which makes the semiconductor structure have a good linearity.

In some embodiments, in the semiconductor structure in the present disclosure, through adjusting the width of the barrier layer in the first polarization regions and second polarization regions, the saturation current of each polarization region is adjusted, and the peak transconductance of the heterojunction structure is adjusted to trend towards uniform, achieving mutual compensation for different transconductances of the device. The wider the width of the barrier layer, the flatter and smaller the transconductance. The narrower the width of the barrier layer, the narrower and higher the transconductance. By adjusting the width and height of the barrier layer in the first polarization regions and second polarization regions, the mutual compensation of different transconductances in the device is achieved, thereby achieving relative stability of transconductance values within a larger gate source bias range.

In some embodiments, the larger the width of the first strip trench or the first protrusion, the higher the proportion of Al component in the barrier layer, and the smaller the width of the first strip trench or the first protrusion, the lower the proportion of Al component in the barrier layer. In the semiconductor structure in the present disclosure, through adjusting the ratio of the width of the first strip trench to the width of the first protrusion, the proportion of Al component in the barrier layer in the first polarization regions and the second polarization regions varies and the thickness of the barrier layer varies. The device preparation and process adjustment in the present disclosure introduce little additional effects and have higher feasibility and repeatability, maintaining high linearity and achieving high breakdown voltage and high output current.

Figure 1:
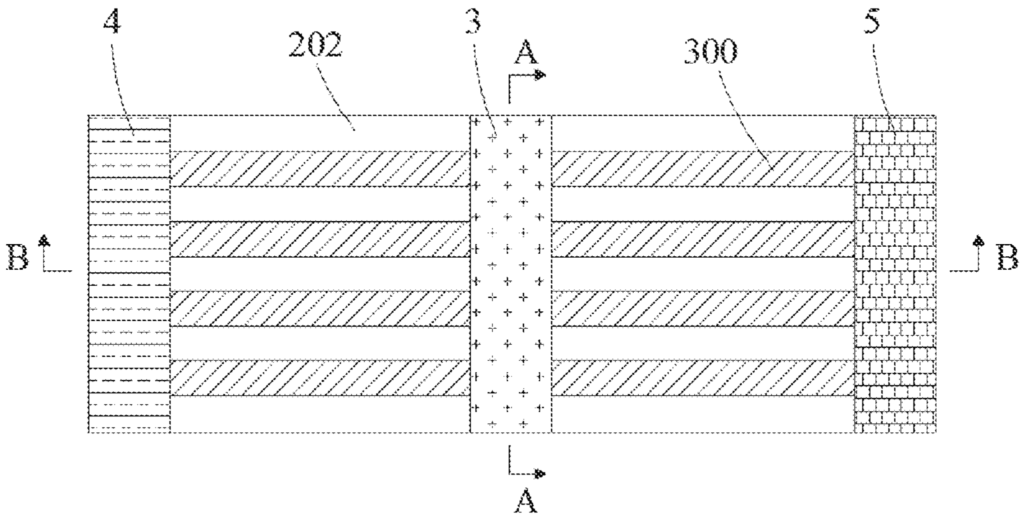
FIG. 1 is a top view of a semiconductor structure according to embodiment 1 of the present disclosure.

Explanation of reference numerals: substrate structure 1; first protrusion 101; substrate 102; heterojunction structure 2; channel layer 201; barrier layer 202; first polarization region 203; second polarization region 204; gate electrode 3; source electrode 4; drain electrode 5; gate dielectric layer 6; back barrier layer 7; P-type semiconductor layer 8; opening 9; first strip trench 100; second strip trench 200; third strip trench 300; fourth strip trench 400; fifth strip trench 500; sixth strip trench 600.

DETAILED DESCRIPTION

Exemplary embodiments will be described in detail herein, examples of which are illustrated in the accompanying drawings. Where the following description refers to the drawings, elements with the same numerals in different drawings refer to the same or similar elements unless otherwise indicated. Embodiments described in the illustrative examples below are not intended to represent all embodiments consistent with the present disclosure. Rather, they are merely embodiments of devices consistent with some aspects of the present disclosure as recited in the appended claims.

Embodiment 1

Figure 2:
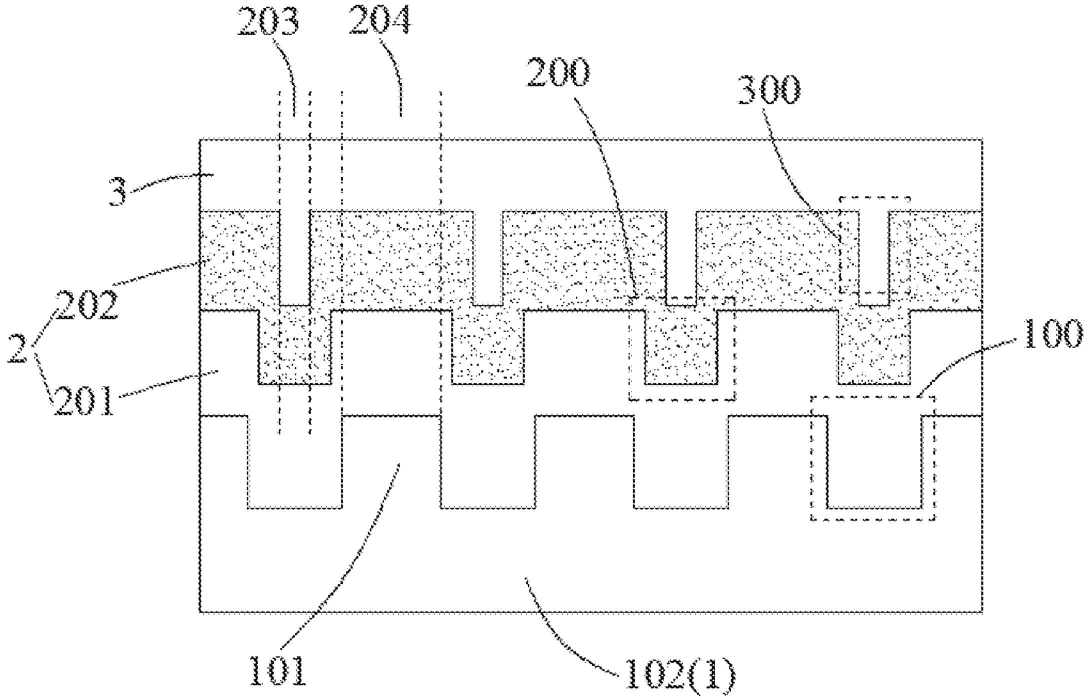
FIG. 2 is a schematic diagram of a semiconductor structure according to embodiment 1 of the present disclosure.

The first embodiment of the present disclosure provides a semiconductor structure and a manufacturing method for a semiconductor structure. FIG. 1 is a top view of a semiconductor structure according to embodiment 1 of the present disclosure. FIG. 2 is a cross-sectional view of the structure shown in FIG. 1 along A-A. The semiconductor structure can include a substrate structure 1, a heterojunction structure 2, a gate electrode 3, a source electrode 4, and a drain electrode 5.

A surface of the substrate structure 1 is provided with first strip trenches 100 and a first protrusion 101 between any adjacent two of the first strip trenches 100, and the first strip trenches 100 and the first protrusions 101 extend in a first direction; the heterojunction structure 2 includes a channel layer 201 and a barrier layer 202. The heterojunction structure 2 conformally covers the substrate structure 1, and the heterojunction structure 2 includes first polarization regions 203 respectively corresponding to the first strip trenches 100 and second polarization regions 204 respectively corresponding to the first protrusions 100. The heterojunction structure 2 includes a source region, a drain region, and a gate region between the source region and the drain region. The source region, the gate region, and the drain region extend in a second direction perpendicular to the first direction. The gate electrode 3 is on the gate region. The source electrode 4 is on the source region. The drain electrode 5 is on the drain region.

The following is a detailed explanation of various parts of the semiconductor structures according to embodiments of the present disclosure.

The substrate structure 1 can include a substrate 102. The substrate 102 can include a silicon substrate, or the substrate 102 can also include a silicon carbide substrate, which is not limited in the embodiments of the present disclosure. The substrate 102 can also include a sapphire substrate etc. The substrate structure 1 may also include a nucleation layer and a buffer layer sequentially arranged on the substrate 102, which is not limited in the present disclosure. A surface of the substrate structure 1 is provided with multiple first strip trenches 100. Each first strip trench 100 extends in the first direction. That is, the extension direction of each first strip trench 100 is the same. The first direction is perpendicular to the thickness direction of the substrate 102. Multiple first strip trenches 100 can be set spaced. A distance between the two adjacent first strip trenches 100 can be less than or equal to 100 nm. A cross-section of the first strip trench 100 can be triangular, rectangular, square, trapezoidal, etc. In some embodiments, the cross-section of the first strip trench 100 can also be of other shapes, such as a case where an inner surface of the first strip trench 100 is a curved surface. The ratio of depth to width of the first strip trench 100 can be 0.3-1, such as 0.3, 0.4, 0.6, 0.7, 0.9, 1, etc. The first strip trench 100 can be a flared structure, that is, an area at the opening of the first strip trench 100 is greater than an area at the bottom of the first strip trench 100. In some embodiments, the area at the opening of the first strip trench 100 can also be less than or equal to the area at the bottom of the first strip trench 100. In addition, the depth of the first strip trench 100 can be smaller than the thickness of the substrate structure 1. In an embodiment, the depths of the first strip trenches 100 are constant and the widths of the first strip trenches 100 change. In an embodiment, the widths of the first strip trenches 100 are constant and the depths of the first strip trenches 100 change. In another embodiment, the widths and depths of the first strip trenches 100 change in proportion. In other embodiments, the widths and depths of the first strip trenches 100 change in inverse proportion. The ratio of depth to width of the first strip trench 100 is 0.3-3.

A first protrusion 101 is formed between two adjacent first strip trenches 100. Each first protrusion 101 extends in the first direction. In an embodiment, the widths of the first strip trenches 100 are constant, and the widths of the first protrusions 101 change. In an embodiment, widths of the first strip trenches 100 change, and widths of the first protrusions 101 are constant. In another embodiment, widths of the first strip trenches and widths of the first protrusions change in proportion. In other embodiments, widths of the first strip trenches and widths of the first protrusions change in inverse proportion.

The heterojunction structure 2 includes a channel layer 201 and a barrier layer 202. The heterojunction structure 2 conformally covers the substrate structure 1. The channel layer 201 is located between the barrier layer 202 and the substrate structure 1. A surface of the channel layer 201 facing away from the substrate structure 1 is provided with multiple second strip trenches 200. Each second strip trench 200 extends in the first direction. Multiple second strip trenches 200 can be set spaced. A cross-section of the second strip trench 200 can be triangular, rectangular, square, trapezoidal, etc. In some embodiments, the cross-section of the second strip trench 200 can also be of other shapes, such as a case where an inner surface of the second strip trench 200 is a curved surface. A cross-sectional shape of the second strip trench 200 can be the same as the cross-sectional shape of the first strip trench 100, and can also be different, which is not limited in the present disclosure. The second strip trench 200 can be a flared structure, that is, an area at the opening of the second strip trench 200 is greater than an area at the bottom of the second strip trench 200. In some embodiments, the area at the opening of the second strip trench 200 can also be less than or equal to the area at the bottom of the second strip trench 200. The second strip trenches 200 respectively correspond to the first strip trenches 100. A protrusion structure is formed between two adjacent second strip trenches 200. The protrusion structure is also in a strip shape and extends in the first direction. A cross-section of the protrusion structure can be triangular, rectangular, square, trapezoidal, etc. In some embodiments, the cross-section of the protrusion structure can also be of other shapes, such as a case where an outer surface of the protrusion structure is a curved surface. In addition, a material of the channel layer 201 can include at least one of GaN, AlGaN, InGaN, or AlInGaN.

The barrier layer 202 conformally covers the channel layer 201, and multiple third strip trenches 300 are formed on the surface of the barrier layer 202 facing away from the substrate structure 1. Each third strip trench 300 extends in the first direction. Multiple third strip trenches 300 can be set spaced. A cross-section of the third strip trench 300 can be triangular, rectangular, square, trapezoidal, etc. In some embodiments, the cross-section of the third strip trench 300 can also be of other shapes, such as a case where an inner surface of the third strip trench 300 is a curved surface. A cross-sectional shape of the third strip trench 300 can be the same as the cross-sectional shape of the second strip trench 200, and can also be different, which is not limited in the present disclosure. The third strip trench 300 can be a flared structure, that is, an area at the opening of the third strip trench 300 is greater than an area at the bottom of the third strip trench 300. In some embodiments, the area at the opening of the third strip trench 300 can also be less than or equal to the area at the bottom of the third strip trench 300. The third strip trenches 300 respectively correspond to the second strip trenches 200. The bottom of the third strip trench 300 can be located on a side of the protrusion structure facing away from the substrate structure 1, that is, the bottom of the third strip trench 300 does not extend into the second strip trench 200. In some embodiments, the bottom surface of the third strip trench 300 can be flush with the top surface of the protrusion structure. A bandgap width of the barrier layer 202 is greater than a bandgap width of the channel layer 201. A material of the barrier layer 202 can include at least one of GaN, AlGaN, InGaN, or AlInGaN.

The heterojunction structure 2 includes a first polarization region 203 and a second polarization region 204 respectively corresponding to the first strip trench 100 and the first protrusion 101, that is, the first polarization region 203 corresponds to the first strip trench 100, and the second polarization region 204 corresponds to the first protrusion 101. A ratio of a width of one of the first polarization regions 203 to a width of one of the second polarization regions 204 is between 0.3 and 3. Thicknesses of the barrier layer 202 in at least two of the first polarization regions 203 are different. Thicknesses of the barrier layer 202 in at least two of the second polarization regions 204 are different. Along the second direction, thicknesses of the barrier layer 202 in the first polarization regions 203 and/or the second polarization regions 204 gradually decrease, gradually increase, first increase and then decrease, first decrease and then increase, or periodically varies. In some embodiments, a material of the barrier layer 202 is AlGaN, where proportions of Al component in the barrier layer 202 in at least two of the first polarization regions 203 are different; and/or proportions of Al component in the barrier layer 202 in at least two of the second polarization regions 204 are different. Along the second direction, the proportions of Al component in the barrier layer 202 in the first polarization regions 203 and/or the second polarization regions 204 gradually decrease, gradually increase, first increase and then decrease, first decrease and then increase, or periodically varies.

The thickness of the barrier layer 202 in the first polarization region 203 is also different from the thickness of the barrier layer 202 in the second polarization region 204. For example, the thickness of the barrier layer 202 in the first polarization region 203 is smaller than the thickness of the barrier layer 202 in the second polarization region 204. Taking a material of the barrier layer 202 including AlGaN as an example, the proportion of Al component in the barrier layer 202 in the first polarization region 203 is different from the proportion of Al component in the barrier layer 202 in the second polarization region 204.

For example, a material of the channel layer 201 includes GaN, and a material of the barrier layer 202 can include AlGaN, AlInGaN, or other compounds containing Al, where the proportion of Al component in a part of the barrier layer 202 corresponding to the protrusion structure can be greater than the proportion of Al component in a part of the barrier layer 202 corresponding to the second strip trench 200, and the thickness of the part of the barrier layer 202 corresponding to the protrusion structure can be greater than the thickness of the part of the barrier layer 202 corresponding to the second strip trench 200. The higher the proportion of Al component in barrier layer 202, the higher the 2DEG content at the heterojunction interface, and the more difficult it is for the gate electrode 3 to control the device. In addition, the larger the thickness of the barrier layer 202, the more difficult it is for the gate electrode 3 to control the device. Due to the presence of a protrusion structure, the gate electrode 3 has different control effects on the heterojunction structure corresponding to the protrusion structure and the second strip trench 200. The second strip trench 200 has a greater distance from the gate electrode 3, resulting in a poorer control effect. In this embodiment, the proportion of Al component in the part of the barrier layer 202 corresponding to the second strip trench 200 can be less than the proportion of Al component in the part of the barrier layer 202 corresponding to the protrusion structure, and/or the thickness of the part of the barrier layer 202 corresponding to the second strip trench 200 can be less than the thickness of the part of the barrier layer 202 corresponding to the protrusion structure. By adjusting the proportion of Al component and/or thickness of the barrier layer at different positions, the linear working characteristics of the semiconductor structure can be improved, and the control ability of the gate electrode 3 on the channel can be improved. In addition, the barrier layer 202 can be an n-type semiconductor, which is not limited in the present disclosure.

The orthographic projection of the gate region on the substrate 102 can be strip-shaped and extend in a second direction. The second direction can be perpendicular to the thickness direction of the substrate 102 and also perpendicular to the first direction. The orthographic projections of the source region and the drain region on the substrate 102 can also be strip-shaped and extend in the second direction. The gate region is located between the source region and the drain region, and the gate region, source region, and drain region are spaced in the first direction. The gate electrode 3 covers the gate region. The source electrode 4 covers the source region. The drain electrode 5 covers the drain region. The source electrode 4 and the drain electrode 5 both form ohmic contact with the heterojunction structure 2. Materials of the gate electrode 3, the source electrode 4 and the drain electrode 5 may be metals, such as Ti/Al/Ni/Au, Ni/Au, etc. In addition, both the source region and the drain region can be provided with n-type semiconductor layers, and the source electrode 4 and drain electrode 5 cover the n-type semiconductor layers, to reduce the ohmic contact resistance.

The manufacturing method for the semiconductor structure according to embodiment 1 of the present disclosure can include steps S100 to S120.

In step S100, a substrate structure 1 is provided, where a surface of the substrate structure 1 is provided with first strip trenches 100 and a first protrusion 101 between any adjacent two of the first strip trenches 100, and the first strip trenches 100 and the first protrusions 101 extend in a first direction.

The first strip trench 100 can be formed by etching, such as dry etching or wet etching.

In step S120, a heterojunction structure 2 is formed on the substrate structure 1, and the heterojunction structure 2 includes a channel layer 201 and a barrier layer 202, where the heterojunction structure 2 conformally covers the substrate structure 1, the heterojunction structure 2 includes first polarization regions 203 respectively corresponding to the first strip trenches 100 and second polarization regions 204 respectively corresponding to the first protrusions 101; where the heterojunction structure 2 includes a source region, a drain region, and a gate region located between the source region and the drain region, and the source region, the gate region, and the drain region extend in a second direction perpendicular to the first direction.

The heterojunction structure 2 can be prepared by epitaxial growth.

In step S130, a gate electrode 3 is formed on the gate region, a source electrode 4 is formed on the source region, and a drain electrode 5 is formed on the drain region.

The gate electrode 3, source electrode 4, and drain electrode 5 can be formed using physical vapor deposition or chemical vapor deposition methods.

The manufacturing method for the semiconductor structure provided in embodiment 1 belongs to the same inventive concept as the semiconductor structure, and descriptions of relevant details and beneficial effects can refer to each other, which is not repeated here.

Embodiment 2

Figure 3:
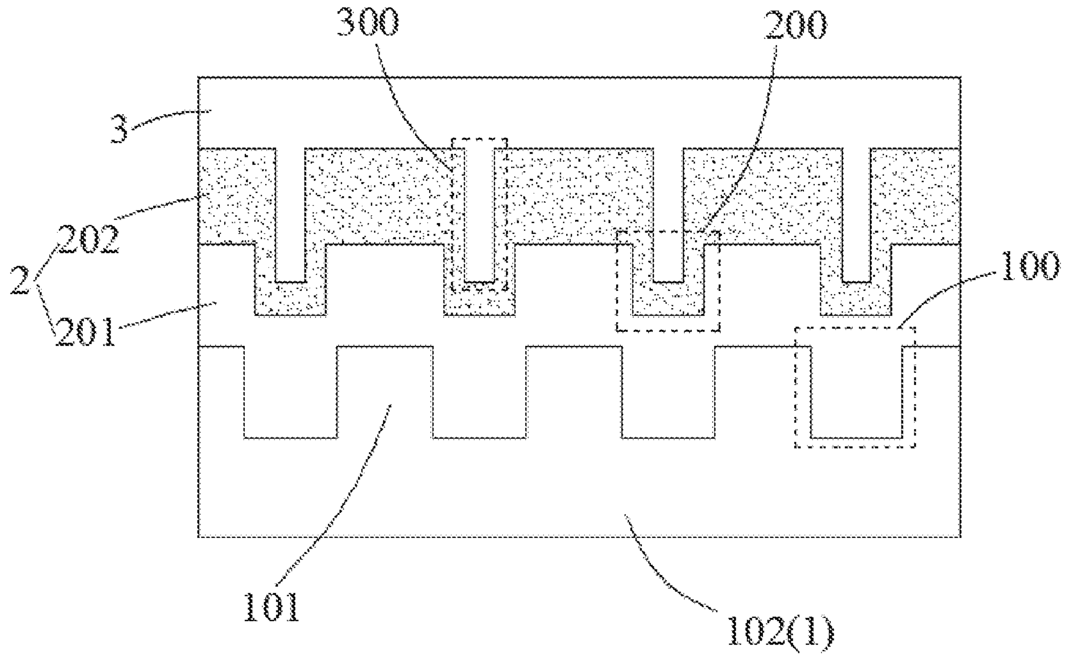
FIG. 3 is a schematic diagram of a semiconductor structure according to embodiment 2 of the present disclosure.

FIG. 3 is a schematic diagram of a semiconductor structure according to embodiment 2 of the present disclosure. A manufacturing method for a semiconductor structure and a semiconductor structure according to embodiment 2 of the present disclosure is roughly the same as those according to embodiment 1 of the present disclosure, except that after the formation of the barrier layer 202, the barrier layer 202 is patterned to extend the bottom of the third strip trench 300 into the second strip trench 200, to improve the control ability of the gate embodiment 3 and thereby improving linearity. Patterning the barrier layer 202 can include thinning the bottom region of the third strip trench 300. In the present disclosure, the bottom region of the third strip trench 300 can be thinned by etching or other methods.

Embodiment 3

Figure 4:
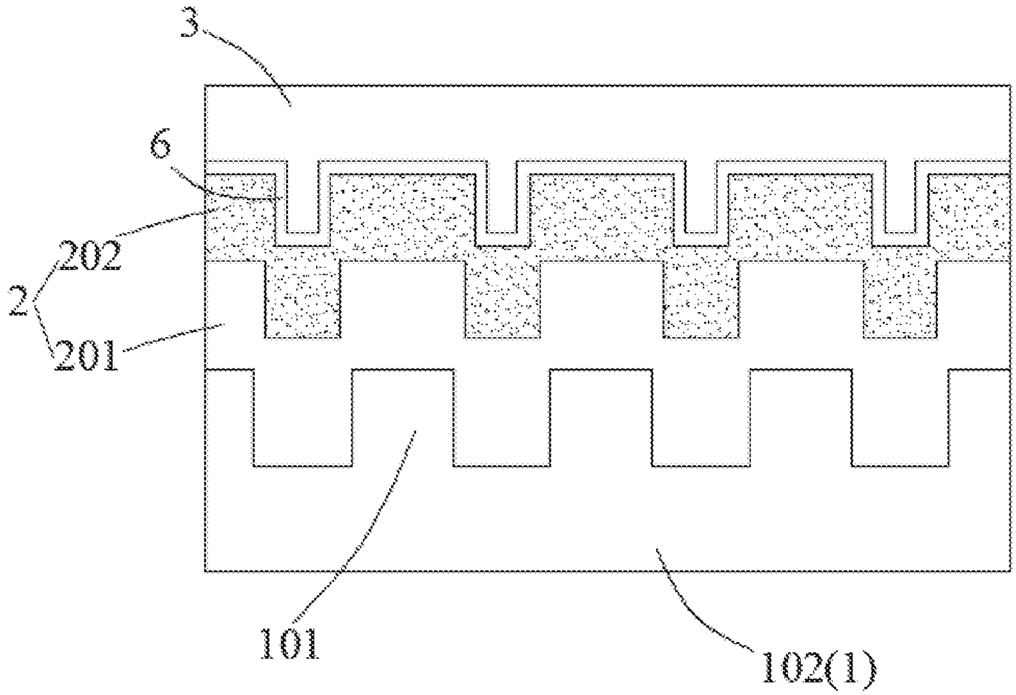
FIG. 4 is a schematic diagram of a semiconductor structure according to embodiment 3 of the present disclosure.

FIG. 4 is a schematic diagram of a semiconductor structure according to embodiment 3 of the present disclosure. The semiconductor structure and manufacturing method for the semiconductor structure in embodiment 3 of the present disclosure are roughly the same as those in embodiment 1 or embodiment 2 of the present disclosure. The difference is that the semiconductor structure further includes a gate dielectric layer 6, that is, the semiconductor structure in embodiment 3 of the present disclosure is a MIS (Metal-Insulator-Semiconductor) structure. The gate dielectric layer 6 covers the gate region, where the gate electrode 3 is on a side of the gate dielectric layer 6 facing away from the substrate structure 1. A material of the gate dielectric layer 6 is an insulating material, such as SiN, SiO2, etc.

Embodiment 4

Figure 5:
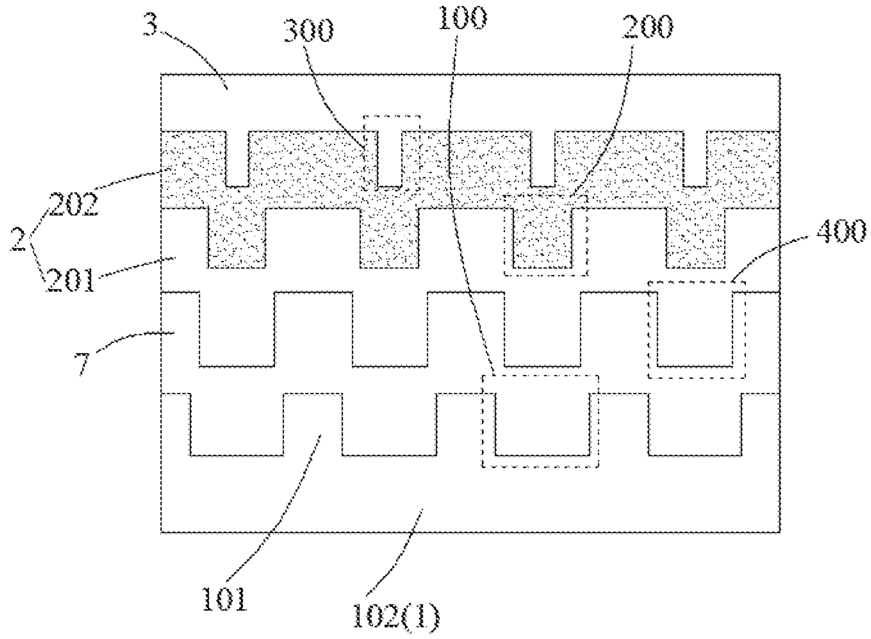
FIG. 5 is a schematic diagram of a semiconductor structure according to embodiment 4 of the present disclosure.

FIG. 5 is a schematic diagram of a semiconductor structure according to embodiment 4 of the present disclosure. The manufacturing method of the semiconductor structure and semiconductor structure in embodiment 4 of the present disclosure is roughly the same as those in any one of embodiments 1 to 3 of the present disclosure, except that the heterojunction structure 2 further includes a back barrier layer 7. The back barrier layer 7 is located on a side of the channel layer 201 facing away from the barrier layer 202, and a surface of the back barrier layer 7 facing the channel layer 201 is provided with multiple fourth strip trenches 400. The channel layer 201 conformally covers the back barrier layer 7. A material of the back barrier layer 7 can include at least one of GaN, AlGaN, InGaN, or AlInGaN. Taking the barrier layer 202 being an n-type semiconductor as an example, the back barrier layer 7 is an n-type semiconductor. The multiple fourth strip trenches 400 respectively correspond to the multiple first strip trenches 100, and the multiple fourth strip trenches 400 respectively correspond to the multiple second strip trenches 200.

Embodiment 5

Figure 6:
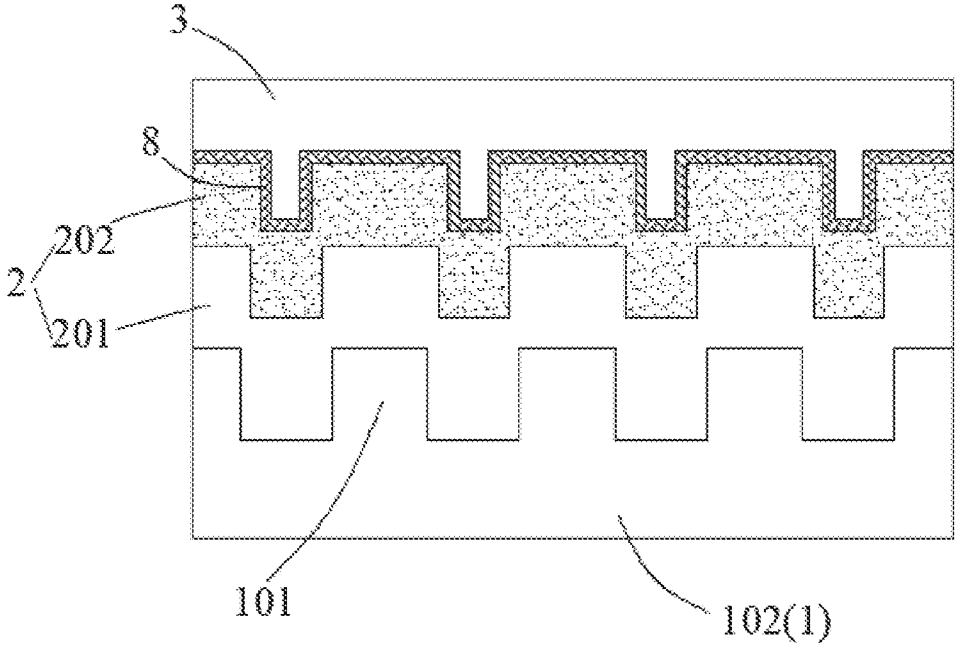
FIG. 6 is a schematic diagram of a semiconductor structure according to embodiment 5 of the present disclosure.

FIG. 6 is a schematic diagram of a semiconductor structure according to embodiment 5 of the present disclosure. The manufacturing method for the semiconductor structure and the semiconductor structure in embodiment 5 of the present disclosure is roughly the same as those in any of embodiments 1 to 4 of the present disclosure. The difference is that the gate region is provided with a p-type semiconductor layer 8, and the gate electrode 3 covers the p-type semiconductor layer 8.

Embodiment 6

Figure 7:
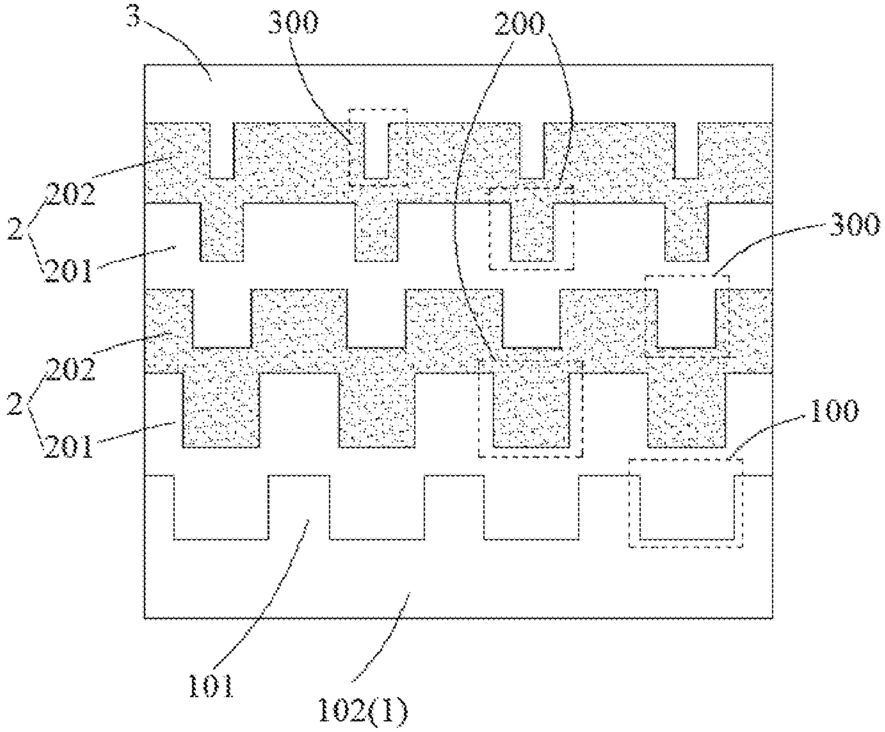
FIG. 7 is a schematic diagram of a semiconductor structure according to embodiment 6 of the present disclosure.
Figure 8:
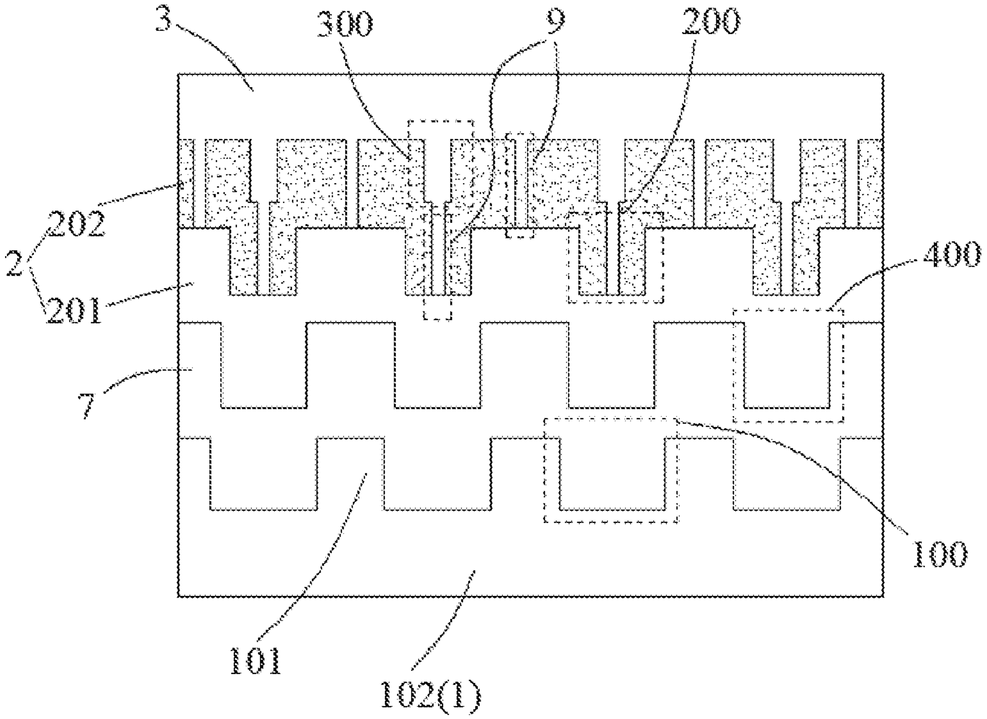
FIG. 8 is a schematic diagram of a semiconductor structure according to embodiment 6 of the present disclosure.

FIG. 7 and FIG. 8 are schematic diagrams of semiconductor structures according to embodiment 6 of the present disclosure. The manufacturing method for the semiconductor structure and the semiconductor structure in embodiment 6 of the present disclosure is roughly the same as those in any of embodiments 1 to 5 of the present disclosure. The difference is that the heterojunction structure 2 includes multiple channel layers 201 and multiple barrier layers 202 that are alternately arranged, that is, the heterojunction structure 2 is a multi-channel structure. In addition, the barrier layer 202 close to the gate electrode 3 in heterojunction structure 2 can be provided with an opening 9, and the opening 9 can be filled by the gate electrode 3. The opening 9 can penetrate the barrier layer 202 close to the gate electrode 3 in the heterojunction structure 2.

Embodiment 7

Figure 9:
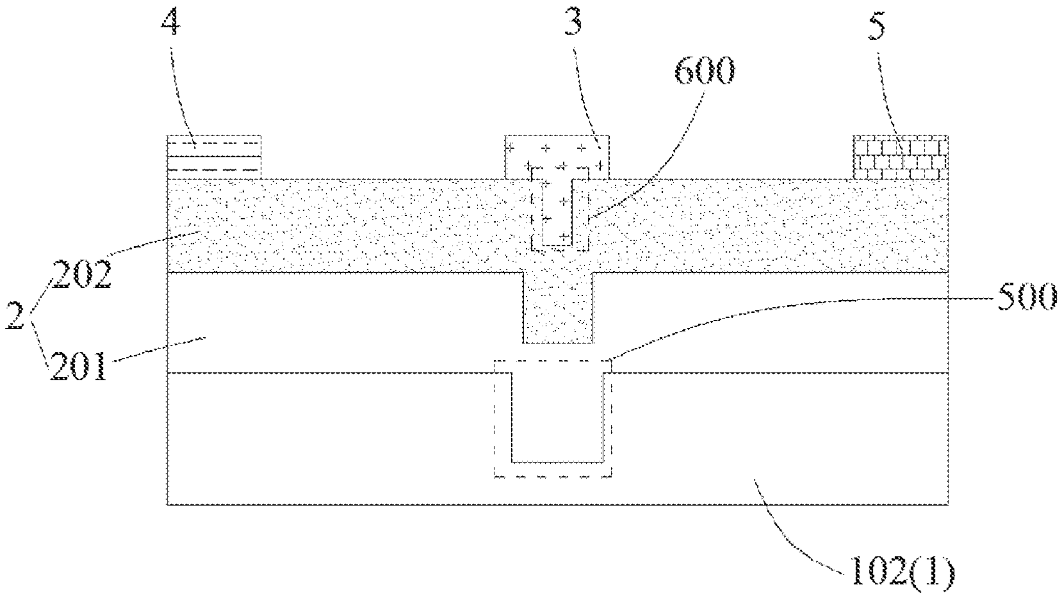
FIG. 9 is a schematic diagram of a semiconductor structure according to embodiment 7 of the present disclosure.

FIG. 1 and FIG. 9 are schematic diagrams of semiconductor structures according to embodiment 7 of the present disclosure. FIG. 9 is a cross-sectional view of the structure shown in FIG. 1 along B-B. The manufacturing method for the semiconductor structure and the semiconductor structure in embodiment 7 of the present disclosure is roughly the same as those in any of embodiments 1 to 6 of the present disclosure. The difference is that a surface of the substrate structure 1 corresponding to the gate region is provided with a fifth strip trench 500, and the fifth strip trench 500 is perpendicular to the first strip trench 100, and the gate region is provided with a sixth strip trench 600 corresponding to the fifth strip trench 500, and the gate electrode 3 fills the sixth strip trench 600. The depth of the sixth strip trench 600 can be less than or equal to the depth of the third strip trench 300, which is not limited in the present disclosure.

The above are only some preferred embodiments of the present disclosure, and do not limit the present disclosure in any form. Although the present disclosure has been disclosed as above in the preferred embodiments, the preferred embodiments are not used to limit the present disclosure. Any skilled person familiar with this profession, without departing from the scope of the technical solutions of the present disclosure, may use the technical content disclosed above to change or modify them into equivalent embodiments with equivalent changes. However, any simple modifications, equivalent changes and modifications made to the above embodiments based on the technical essence of the present disclosure, which do not deviate from the content of the technical solution of the present disclosure, still fall within the scope of the technical solution of the present disclosure.

What is claimed is:

1. A semiconductor structure, comprising:

a substrate structure, wherein a surface of the substrate structure is provided with a plurality of first strip trenches and a plurality of first protrusions, each of the first protrusions disposed between adjacent ones of the first strip trenches, and wherein the first strip trenches and the first protrusions extend in a first direction;

a heterojunction structure, comprising a channel layer and a barrier layer, wherein the heterojunction structure conformally covers the substrate structure, and the heterojunction structure comprises first polarization regions respectively corresponding to the first strip trenches and second polarization regions respectively corresponding to the first protrusions; wherein the heterojunction structure comprises a source region, a drain region, and a gate region located between the source region and the drain region, and the source region, the gate region, and the drain region extend in a second direction perpendicular to the first direction;

a gate electrode on the gate region;

a source electrode on the source region; and a drain electrode on the drain region;

wherein thicknesses of the barrier layer in at least two of the first polarization regions are different; and/or thicknesses of the barrier layer in at least two of the second polarization regions are different.

2. The semiconductor structure according to claim 1, wherein a thickness of the barrier layer in each of the first polarization regions is different from a thickness of the barrier layer in each of the second polarization regions.

3. The semiconductor structure according to claim 2, wherein a thickness of the barrier layer in each of the first polarization regions is smaller than a thickness of the barrier layer in each of the second polarization regions.

4. The semiconductor structure according to claim 1, wherein a material of the barrier layer is AlGaN, and a proportion of Al component in the barrier layer in the first polarization regions is different from a proportion of Al component in the barrier layer in the second polarization regions.

5. The semiconductor structure according to claim 1, wherein widths of the first strip trenches are constant, and widths of the first protrusions change; or widths of the first strip trenches change, and widths of the first protrusions are constant; or widths of the first strip trenches and widths of the first protrusions change in proportion; or widths of the first strip trenches and widths of the first protrusions change in inverse proportion.

6. The semiconductor structure according to claim 1, wherein a ratio of a width of one of the first polarization regions to a width of one of the second polarization regions is between 0.3 and 3.

7. The semiconductor structure according to claim 1, wherein along the second direction, thicknesses of the barrier layer in the first polarization regions and/or the second polarization regions gradually decrease, gradually increase, first increase and then decrease, first decrease and then increase, or periodically vary.

8. The semiconductor structure according to claim 1, wherein a material of the barrier layer is AlGaN, wherein proportions of Al component in the barrier layer in at least two of the first polarization regions are different; and/or proportions of Al component in the barrier layer in at least two of the second polarization regions are different.

9. The semiconductor structure according to claim 8, wherein along the second direction, the proportions of Al component in the barrier layer in the first polarization regions and/or the second polarization regions gradually decrease, gradually increase, first increase and then decrease, first decrease and then increase, or periodically vary.

10. The semiconductor structure according to claim 1, wherein depths of the first strip trenches are constant, and widths of the first strip trenches change; or widths of the first strip trenches are constant and depths of the first strip trenches change; or widths and depths of the first strip trenches change in proportion; or widths and depths of the first strip trenches change in inverse proportion.

11. The semiconductor structure according to claim 1, wherein a ratio of a depth to a width of each of the first strip trenches is 0.3-3.

12. The semiconductor structure according to claim 1, further comprising:

a gate dielectric layer covering the gate region, wherein the gate electrode is on a side of the gate dielectric layer facing away from the substrate structure.

13. The semiconductor structure according to claim 1, wherein the heterojunction structure further comprises:

a back barrier layer on a side of the channel layer facing away from the barrier layer.

14. The semiconductor structure according to claim 1, wherein the heterojunction structure is a multi-channel heterojunction, comprising multiple channel layers and multiple barrier layers alternately arranged from bottom to top.

15. The semiconductor structure according to claim 14, wherein at least two of the multiple barrier layers have different thicknesses and/or proportions of a component.

16. The semiconductor structure according to claim 1, wherein the substrate structure comprises a fifth strip trench on a surface corresponding to the gate region, and the fifth strip trench is perpendicular to the first strip trenches; and the gate region is provided with a sixth strip trench corresponding to the fifth strip trench, and the gate electrode fills the sixth strip trench.

17. The semiconductor structure according to claim 1, wherein both the source region and the drain region are provided with n-type semiconductor layers, and the source electrode and the drain electrode cover the n-type semiconductor layers.

18. The semiconductor structure according to claim 1, wherein the gate region is provided with a p-type semiconductor layer, and the gate electrode covers the p-type semiconductor layer.

19. A manufacturing method for a semiconductor structure, comprising:

providing a substrate structure, wherein a surface of the substrate structure is provided with a plurality of first strip trenches and a plurality of first protrusions, each of the first protrusions disposed between adjacent ones of the first strip trenches, and wherein the first strip trenches and the first protrusions extend in a first direction;

forming a heterojunction structure on the substrate structure, wherein the heterojunction structure comprises a channel layer and a barrier layer, the heterojunction structure comprises first polarization regions respectively corresponding to the first strip trenches and second polarization regions respectively corresponding to the first protrusions; wherein the heterojunction structure comprises a source region, a drain region, and a gate region located between the source region and the drain region, and the source region, the gate region, and the drain region extend in a second direction perpendicular to the first direction;

forming a gate electrode on the gate region;

forming a source electrode on the source region; and forming a drain electrode on the drain region;

wherein forming the heterojunction structure comprises forming the barrier layer such that thicknesses of the barrier layer in at least two of the first polarization regions are different; and/or thicknesses of the barrier layer in at least two of the second polarization regions are different.

20. A semiconductor structure, comprising:

a substrate structure, wherein a surface of the substrate structure is provided with a plurality of first strip trenches and a plurality of first protrusions, each of the first protrusions disposed between adjacent ones of the first strip trenches, and wherein the first strip trenches and the first protrusions extend in a first direction;

a heterojunction structure, comprising a channel layer and a barrier layer, wherein the heterojunction structure conformally covers the substrate structure, and the heterojunction structure comprises first polarization regions respectively corresponding to the first strip trenches and second polarization regions respectively corresponding to the first protrusions; wherein the heterojunction structure comprises a source region, a drain region, and a gate region located between the source region and the drain region, and the source region, the gate region, and the drain region extend in a second direction perpendicular to the first direction;

a gate electrode on the gate region;

a source electrode on the source region; and a drain electrode on the drain region;

wherein the heterojunction structure is a multi-channel heterojunction, comprising multiple channel layers and multiple barrier layers alternately arranged from bottom to top.

* * * * *